United States Patent [19]

Nossen

[11] 4,021,757
[45] May 3, 1977

[54] PHASE LOCK-LOOP MODULATOR USING AN ARITHMETIC SYNTHESIZER

[75] Inventor: Edward Joachim Nossen, Cherry Hill, N.J.

[73] Assignee: RCA Corporation, New York, N.Y.

[22] Filed: Apr. 8, 1976

[21] Appl. No.: 675,080

[52] U.S. Cl. .................................. 332/19; 325/148
[51] Int. Cl.² .......................................... H03C 3/00
[58] Field of Search ................ 332/19, 16 R, 16 T, 332/9 R, 9 T; 325/45, 148; 328/155

[56] References Cited
UNITED STATES PATENTS

| 3,689,914 | 9/1972 | Butler | 328/14 |
| 3,838,350 | 9/1974 | Ewanus et al. | 329/104 |

Primary Examiner—John Kominski
Attorney, Agent, or Firm—Carl M. Wright; H. Christoffersen; Samuel Cohen

[57] ABSTRACT

A phase lock loop has a phase modulator within the loop to produce an output signal of frequency shifted or modulated RF. The modulator is controlled by input signals via an arithmetic synthesizer.

3 Claims, 3 Drawing Figures

PHASE LOCK-LOOP MODULATOR USING AN ARITHMETIC SYNTHESIZER

The United States Government has rights in this invention pursuant to Contract No. DAAB07-71-C-0182 awarded by the Department of the Army.

BACKGROUND OF THE INVENTION

The design objectives of frequency synthesizers include wide frequency range, fine frequency resolution, low spurious response, low noise levels, and rapid switching to other frequencies within its range. Also, it is desirable to have an inherent capability of providing any form of angle modulation, such as bi-phase, quadriphase, MSK, and FSK or FM to reduce the need for auxiliary modulation circuits. The disclosed invention achieves the above-mentioned objectives as described below. Prior art approaches to frequency synthesizers have included direct synthesizers utilizing a multiplicity of selectable frequency sources and mixing stages. Other approaches include indirect synthesizers utilizing one or more phaselock loops to achieve the desired number of frequencies. Achieving small frequency increments with reasonably fast switching times has required the use of multiple loops. Furthermore, modulation is generally applied externally by mixing the synthesizer output signal with a modulated fixed frequency signal.

SUMMARY OF THE INVENTION

A phase lock loop includes a voltage controlled oscillator (VCO), a phase detector with one input from a clock, and a low pass filter for coupling the output signal from the phase detector to the VCO to control its frequency. A modulator couples the signal from the VCO to the phase detector to shift or to modulate the frequency of the VCO. A modulator control is provided for coupling a modulating signal to the modulator.

BRIEF DESCRIPTION OF THE DRAWING

In the drawings, like numbers specify like elements.

DETAILED DESCRIPTION OF THE INVENTION

Figure 1:
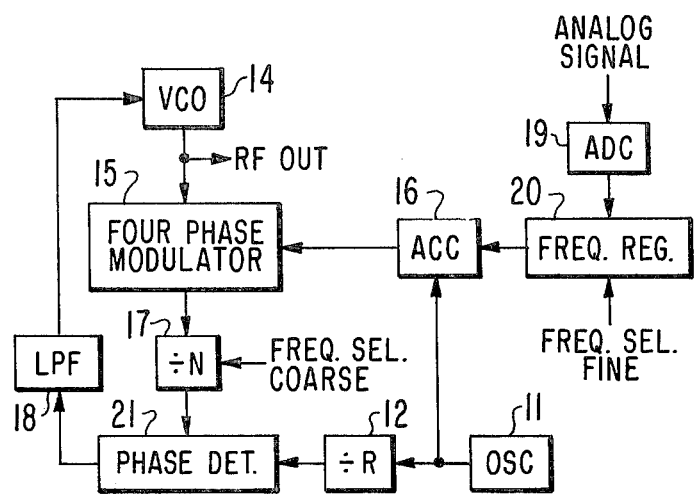
FIG. 1 is a block diagram of a preferred embodiment of the invention.

FIG. 1 shows a voltage controlled oscillator (VCO) 14 coupled to a four-phase modulator 15 which is coupled to a programmable divide-by-N counter 17. The purpose of the counter 17 will be described below. The output signal from the counter 17 is coupled as one input signal to a phase detector 21, whose other input signal is from a clock source oscillator 11 which may be coupled thereto via a divide-by-R counter 12. The output signal from the phase detector 21 is filtered by a low pass filter 18 and coupled to control the frequency of the VCO 14. The bandwidth of this loop must be wide enough to include all the modulation frequencies of interest.

Four-phase modulators and single side band modulators are well known in the art and need not be described in detail. (See, for example, U.S. Pat. No. 3,838,350 and, for phase modulators generally, U.S. Pat. No. 3,755,739. See also, *Information Transmission, Modulation and Noise*, Schwartz, 2d edition, (McGraw-Hill, 1970, Chap. 4). The four-phase modulator 15 is controlled by the output signal from an accumulator 16. The accumulator 16 and a frequency register 20 form an arithmetic synthesizer. The arithmetic synthesizer driving the four-phase modulator 15 makes possible the transmission of analog signals or digital signals, the analog signals being converted to digital signals by an analog-to-digital converter 19. The operation of an arithmetic synthesizer is described in detail in a patent to Butler (U.S. Pat. No. 3,689,914), assigned to the same assignee as this application.

A digital accumulator is an operating device for adding an input digital signal to a stored digital signal in response to a control or clocking pulse. The output signal from the accumulator is the stored digital value, which is increased at each clocking pulse by an amount equal to the input signal. An accumulator can be assembled from commercially available device. For example, an arithmetic-logic unit (ALU) such as an integrated circuit type SN 74181 (Texas Instruments, Inc.) can be coupled to receive at one set of input terminals the input digital signal and, at the other set of input terminals, the stored digital signal. The output signals from the ALU can be coupled, each to a D-input terminal of a separate D-type flip-flop, each clock input signal of the flip-flops being coupled in common to the control or clocking pulse. Integrated circuits having a plurality of flip-flop stages with common clock signals are commercially available, e.g., type SN 7475 (four stages) or SN 74100 (eight stages) (Texas Instruments, Inc.). The output signals from the flip-flops are the stored digital value. The devices described can be cascaded to form digital words of any desired number of bits. For n bits (stages), addition (or subtraction) is performed modulo $2^n$, but an overflow or carry signal is provided when the ALU output value exceeds $2^n-1$. The ALU described can also, by means of function control signals, perform increment, decrement, subtract, complement, shift, AND, OR, Exclusive-OR, and various other specialized functions as described in the application notes therefor.

By changing the value stored in the frequency register 20, small frequency changes in the VCO output signal can be controlled by effecting a single side band modulation (translation). Larger changes in the VCO frequency are made by changing the value of N in the divide-by-N counter 17. The divide counters 12 and 17 permit the center frequency of the VCO 14 to vary from the frequency of the clock oscillator 11. Letting $f_{VCO}$ represent the nominal VCO frequency and $f_o$, the oscillator frequency, then the phase detector 21 produces an output signal proportional to $f_{VCO}/N - f_o/R$ to control the VCO. Therefore, $f_{VCO} = Nf_o/R$. By varying N or R, $f_{VCO}$, i.e., the output frequency, can be varied. This is further varied by the offset frequency from the arithmetic synthesizer via the four-phase modulator 15.

In many applications of frequency synthesizers, a wide loop bandwidth is desirable to achieve rapid frequency switching and to allow the loop to produce or to follow angle modulations. Use of a higher reference frequency enables implementation of a wider loop bandwidth. Since the reference frequency from the clock divide-by-R counter 12 may be 100 kHz or higher, frequency interpolation must be provided by the arithmetic synthesizer to achieve typical 25 kHz radio channel spacings. In the preferred embodiment, the frequency interpolation is accomplished by the single sideband modulation/ translation capabilities of the four-phase modulator 15. With the appropriate in-phase and quadrature drive signals to the four-phase modulator, an upper or lower sideband translation can be effected. (This is shown in more detail in connection with FIG. 2) The amount of frequency translation is a direct function of the offset frequency produced by the arithmetic synthesizer.

The modulation capability of the frequency synthesizer is a result of the exceptionally fast response of the arithmetic synthesizer to any change up to the clock frequency. Modulation capability is limited only by the bandwidth of the phase lock loop. For data modulation, the use of binary FSK is assumed, which means that two frequencies must be generated. These frequencies can be generated without spurious components if they are integer submultiples of the clock frequency. Voice signals can be sent in a variety of ways. Common approaches include amplitude or frequency modulation. Voice signals are often digitized and transmitted in digital form to permit multiplexing or encryption.

Digital voice transmission by means of FSK can be accomplished by selection of appropriate Mark and Space frequencies from the arithmetic synthesizer. The advantage of this approach is that only a single phase lock loop is needed for the entire carrier generation process. Because of the loop's bandwidth, voice and data modulation can be introduced and the VCO can follow this modulation, impressing it on the transmitted carrier. With the described invention, voice signals can be transmitted as analog frequency-modulated signals for demodulation with existing receivers. The modulation, however, is accomplished using digital techniques which are highly reproducible and permit low cost implementation with integrated circuit technology.

Voice modulation is implemented using an analog-to-digital converter 19. The digital number from the converter output, which represents an instantaneous value of the analog speech, directly controls the arithmetic synthesizer via the frequency register 20 to produce frequency modulation. Digitized voice with six bits quantization at an 8 kiloHertz sample rate provides good speech quality and speaker recognition.

Continuous frequency modulation of the digitized voice signals requires the arithmetic synthesizer to produce frequencies at finer increments than the channel spacing or the Mark-Space separation in digital transmissions. Frequency increments as fine as 10 Hz may be required to avoid audio distortion in the transmitted voice signal.

The arithmetic synthesizer has no inherent spurious output signals when the clock frequency from the oscillator 11 is an integer multiple of the output frequency. This is due to the synchronous relationship between the clock and the output frequency. By proper choice of numbers in the frequency register 20, the arithmetic synthesizer can be used as a clean offset signal source with 25 kHz spacing, as shown in Table I below, where $f_s$ is the synthesized output frequency from the accumulator 16. (any integer value can be used for K.) The arithmetic synthesizer has no inherent limiting noise floor when used in an all digital mode and when the integer multiple requirement is met. For example, with 16 bits in the arithmetic synthesizer, the noise floor is −96 dB noise and with 24 bits, it is −144 dB.

When used in the analog voice mode, many nonsynchronous frequencies will be generated; some of these will introduce some spurious components. These spurious signals will be present for a very short time and appear all cross the modulation band with very low energy. When a noise-like signal, such as voice is used, the spurious frequencies will occupy the entire channel in a random fashion and act merely to raise the noise floor. Even a single tone will produce many Bessel components.

Any spurious signal energy present in the arithmetic synthesizer and the four-phase modulator 15 is reduced via the divide-by-N counter 17 by a factor equivalent to the square of N. By keeping the spurious frequencies outside the loop's passband, they will not affect the VCO and, therefore, will not appear with the desired output frequency. This can be implemented by operating the arithmetic frequency synthesizer with an output frequency well above the loop's bandwidth.

Figure 2:
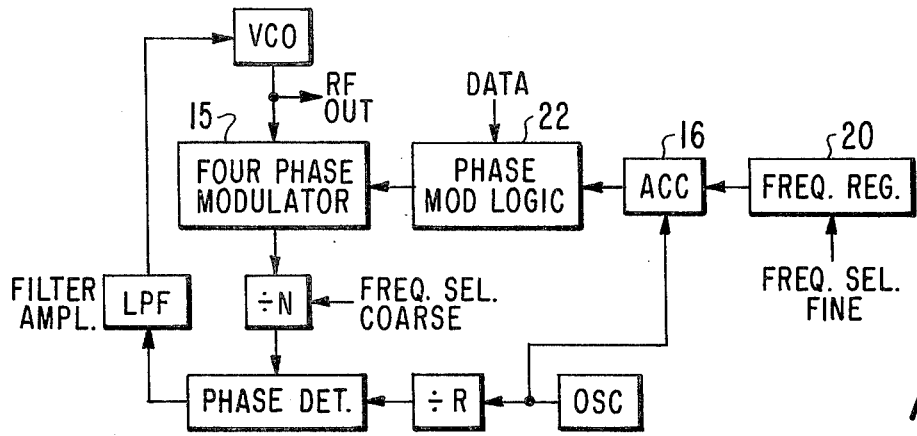
FIG. 2 is a block diagram of a modified version of the preferred embodiment.

FIG. 2 is a block diagram of an embodiment of the invention well suited to phase modulation. The configuration is the same as that previously described for FIG. 2 except the analog-to-digital converter is eliminated and a phase modulation logic 22 is coupled between the accumulator 16 and the four-phase modulator 15.

The frequency of the synthesizer comprising the frequency register 20 and the accumulator 16 is a constant depending on the value set into the frequency register 20. The phase modulation logic 22 responds to the binary data to effect a phase shift of the frequency synthesizer output signal.

The arithmetic synthesizer provides in-phase and quadrature signals from the two most significant bits of the accumulator 16 and can generate a 90° and 270° offset by adding 01 and 11 in binary, thereto, respectively. Inversion of these bits results in an upward or downward frequency translation which doubles the coverage of the arithmetic synthesizer, and provides a means for phase modulation of the carrier. In the embodiment shown in FIG. 2, many forms of phase modulation can be achieved. These include bi-phase, quadri-phase, offset keyed (staggered), quadri-phase, and minimum shift keying (MSK). (A unidirectional PSK (UPSK) system is described in U.S. patent application Ser. No. 649,547, filed Jan. 15, 1976, assigned to the same assignee as this application.) Details of such drive signal generation to achieve these modulations using a four-phase modulator are covered in the prior art.

Bi-phase and quadri-phase PSK are implemented by the logic 22 in the drive circuits to the four-phase modulator 15. By performing the modulation within the loop, the output signal taken from the VCO will be phase continuous and will have constant amplitude. Control of the loop bandwidth with respect to the modulation rate will limit the rate of phase change and thus control the spectral sidelobes. By selecting proper loop parameters, MSK characteristics can be approached without the use of amplitude modulators.

As an example of a phase modulation logic, let the phase be defined by the values of the two most significant bits (MSB's) from the accumulator 16 as follows:

TABLE I

| Phase Signals | | |
|---|---|---|
| Accumulator | | |
| MSB | MSB-1 | Phase (deg.) |
| 0 | 0 | 0 |
| 0 | 1 | 90 |
| 1 | 0 | 180 |

TABLE I-continued

| Phase Signals | | |
|---|---|---|
| Accumulator | | |
| MSB | MSB-1 | Phase (deg.) |
| 1 | 1 | 270 |

If 01 is added to the values of the accumulator's two MSB's, a phase shift of 90° is effected; adding 10 effects a phase shift of 180°; and adding 11 effects phase shift of 270°. This provides quadri-phase modulation.

Inverting the accumulator's two MSB's shifts the phase in the opposite direction. Adding bits as described above will cause the phase to shift as before. The sideband, however, will be of the opposite polarity. Therefore, by inverting both MSB's, FSK modulation can be accomplished.

Bi-phase modulation can be accomplished by inverting only the MSB under the control of a single data bit.

Figure 3:
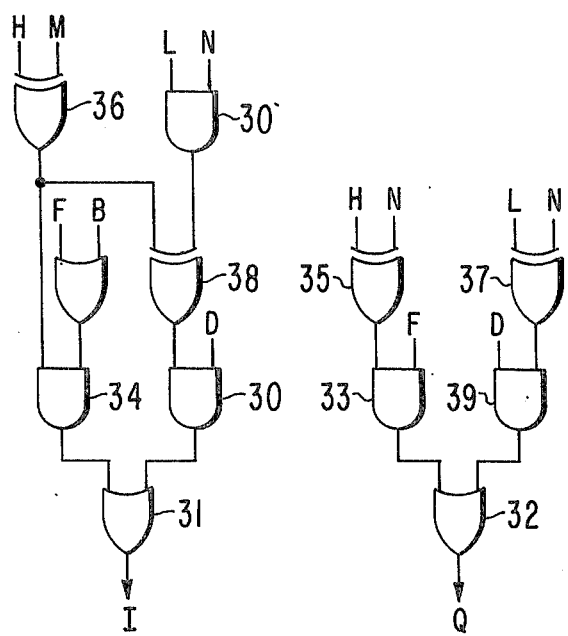
FIG. 3 is a logic diagram of a modulation logic circuit.

Therefore, the phase modulation logic 22 in FIG. 2 can be implemented as shown in FIG. 3. The I and Q signals from the OR gates 31 and 32, respectively, are the In-phase and quadrature signals to the four-phase modulator 15 (FIG. 2).

The F, B, and D input signals are control signals denoting the type of modulation desired, i.e., FSK, biphase, or quadriphase, respectively. They are mutually exclusive signals. The signals H and L represent the data bits where H is the higher order of the two. The signals M and N are the MSB's from the accumulator, the M signal being the MSB.

When the B signal is high, the high order data bit inverts the MSB from the accumulator when the data has a value of one and does not invert it otherwise, via an exclusive-OR gate 36 and AND gate 34. The Q output signal does not change. This causes the four-phase modulator to bi-phase modulate the carrier.

When the F signal is high, both MSB's from the accumulator are inverted or not according to the value of the data bit. The I signal is generated via the exclusive-OR gate 36, AND gate 34, and the OR gate 31. The Q signal is generated via an exclusive-OR gate 35, an AND gate 33, and the OR gate 32. This produces FSK modulation.

For quadri-phase modulation, the D control signal is high and two data bits are added to the two MSB's from the accumulator as described above. The two lower order bits are added via an exclusive-OR gate 37 and gated by the D control signal via an AND gate 39 to the OR gate 32. The higher order bits are added in the exclusive-OR gate 36 and the result added to a carry bit from the lower order bits, if any, as provided by an AND gate, by an exclusive-OR gate 38, and the sum is gated to the OR gate 31 via an AND gate 30.

A four-phase modulator such as shown on page 221 of the Schwartz reference operates on a Gray code configuration. In such a case, the I and Q output signals can be converted to Gray code by means well known in the art. For example, the I signal remains the same and the Gray Q signal is the exclusive-OR value of the I and Q binary signals.

Various modifications to the systems and circuits described and illustrated to explain the concepts and modes of practicing the invention might be made by those of ordinary skill in the art within the principles or scope of the invention as expressed in the appended claims.

What is claimed is:

1. In a phase lock loop including voltage-controlled oscillator means, phase detector means coupled to clock means, and low pass filter means for coupling an output signal from the phase detector means to control the frequency of an output signal from said voltage-controlled oscillator means, the improvement comprising:
    phase modulator means coupling said output signal to said phase detector means for modulating and for translating the frequency of said voltage-controlled oscillator; and
    modulator control means for coupling a modulating signal to said modulator means.

2. The invention as claimed in claim 1 wherein said modulator means is a four-phase modulator.

3. The invention as claimed in claim 1 wherein said modulator control means includes an arithmetic synthesizer.

* * * * *